United States Patent [19]
Hsu et al.

[11] Patent Number: 6,012,607
[45] Date of Patent: Jan. 11, 2000

[54] DISPENSE SYSTEM OF A PHOTORESIST COATING MACHINE

[75] Inventors: Hsien-Jung Hsu, Kaohsiung; Shih-Hsun Chiu, Hsinchu Hsien; Hung-Lung Ma, Miao-Li Hsien; Cha-Ming Kuo, Chi-Lung, all of Taiwan

[73] Assignee: United Microelectronics Corp., Hsinchu, Taiwan

[21] Appl. No.: 09/185,436

[22] Filed: Nov. 3, 1998

[51] Int. Cl.[7] .................................................. B67D 5/08
[52] U.S. Cl. ...................... 222/52; 222/189.11; 222/504
[58] Field of Search ............................. 222/52, 53, 152, 222/189.06, 189.11, 318, 383.1, 424, 504

[56] References Cited

U.S. PATENT DOCUMENTS

| | | | |
|---|---|---|---|
| 4,779,762 | 10/1988 | Klein et al. | 222/52 |
| 5,148,945 | 9/1992 | Geatz | 222/152 |
| 5,262,068 | 11/1993 | Bowers et al. | 222/189.11 |
| 5,641,006 | 6/1997 | Autrey et al. | 222/52 |
| 5,868,278 | 2/1999 | Chen | 222/152 |

FOREIGN PATENT DOCUMENTS

| | | | |
|---|---|---|---|
| 9109800 | 7/1991 | WIPO | 222/52 |

*Primary Examiner*—Joseph A. Kaufman
*Attorney, Agent, or Firm*—Knobbe, Martens, Olson & Bear, LLP

[57] ABSTRACT

A photoresist dispensing system used in a photoresist coating machine includes a pump, a switch valve, a sucking-back valve, a solenoid valve, a first set of speed controllers a second set of speed controllers and a sucking-back speed controller. The pump is used to transport liquid photoresist to a wafer through the switch valve. The sucking-back valve is controlled by solenoid valve through the sucking-back speed controller to produce or release a sucking force on the liquid photoresist to prevent it from undesired dropping onto the wafer. The solenoid valve also controls the switch valve and the pump to start or stop photoresist dispensing. The first set of speed controllers is coupled between the switch valve and the solenoid valve and the second set of speed controller is coupled between the pump and the solenoid valve. The sucking-back speed controller is coupled between the sucking-back valve and the route, which is between the first set of speed controller and the switch valve so that the sucking-back valve has a sufficient delay time to effectively suck the liquid photoresist in a proper time order of operation.

16 Claims, 3 Drawing Sheets

DISPENSE SYSTEM OF A PHOTORESIST COATING MACHINE

BACKGROUND OF THE INVENTION

1. Field of the Invention

This invention relates to a photoresist coating machine, and more particularly to improving a dispensing system used in a photoresist coating machine.

2. Description of Related Art

Photolithography plays an essential role in semiconductor fabrication. All semiconductor devices need several photolithography process to transfer desired patterns so as to form the devices as designed. A semiconductor device usually includes, for example, a transistor structure with proper doping regions, a capacitor, and an interconnecting structure for connection between each component. All these needs several different photolithography processes. A more complex structure accordingly needs more photolithography processes.

The detailed photolithography technology is usually complicated but its theory is straightforwardly simple. Generally, a photoresist layer is coated on a device wafer surface, on which a device is fabricated. The photoresist layer then is exposed by a light source through a photomask, which carries a pattern to be transferred onto the device wafer surface. The photoresist layer includes photo-sensitive material that can be exposed to light to selectively change its material property. After development, the remaining photoresist layer on the device wafer surface forms the desired pattern. The desired pattern therefore is transferred to the device wafer. Up to this stage, the photolithography process is done. A subsequent process, such as etching or doping, are performed to form one sub-structure of the device, which usually includes several different sub-structures. So, a more complex structure accordingly needs more photolithography processes.

Currently, the photoresist layer can be formed by a spin coating process so as to obtain its thickness uniformity and adhesion without defects. FIG. 1 is a side view of a conventional spinner used for spin coating. A wafer 12 is held by a spinner 10. The spinner 10 fixes the wafer 12 by sucking it with a vacuum force, which is created through a rotating axle of the spinner 10. As the wafer 10 is rotated by the spinner 12, a liquid photoresist 14 sprayed on the wafer 12 is outwardly distributed due to centrifugal force. The liquid photoresist 14 contains volatile organic solution. After volatilization, a uniform photoresist layer 16 with strong adhesion is formed over the wafer 10.

FIG. 2 is schematic drawing of a conventional photoresist dispensing system included in a photoresist coating machine. In FIG. 2, the photoresist coating machine is, for example, a D-SPIN type. A conventional photoresist dispensing system includes a transporting part and a control part. The transporting part includes a container 21 that contains a liquid photoresist 20. A pump 23 is used to pump the liquid photoresist 20 from the container 21 through a transporting duct 90. The pump 23 transports the liquid photoresist 20 to a filter 24 and then to an orifice valve 25, which determines whether the liquid photoresist 20 is to be sent to a wafer 22 or not. If the liquid photoresist 20 is to be sent to the wafer 22, the liquid photoresist passes a sucking-back valve 26 and is transported along the duct 90.

The control part includes a solenoid valve 27 to control the actions of the orifice valve 25 and the sucking-back valve 26 by switching between two modes. One is a starting mode that the dispensing system is switched from a resting status to a working status. The other one is a stopping mode that the dispensing system is switched from a working status to a resting status. The control part uses air-flow to achieve its purpose of control. The air flows along a route 91. The solenoid valve 27 includes an air-in end AIR and an air-out end EXH. Air can be injected from the air-in end AIR and exhausted from the air-out end EXH. The solenoid valve 27 uses the EXH and the AIR to switch system between the starting mode and the stopping mode. The sucking-back valve 26 is controlled by the solenoid valve 27 through air-flow to produce or release a sucking force, which suck back the liquid photoresist 20. The orifice valve 25 is controlled by the solenoid valve 27 through air-flow to determine whether the liquid photoresist 20 is transported to the wafer 22 or not.

Between the solenoid valve 27 and the orifice valve 25, there are two speed controllers SC1, SC2. The speed controller SC1 is coupled between the AIR of the solenoid valve 27 and the orifice valve 25 at a first input/output (I/O) end 30. The speed controller SC2 is coupled between the EXH of the solenoid valve 27 and the orifice valve 25 at a second I/O end 33. Each speed controller used in the photoresist dispensing system is identical and is used to control a switching speed of action. The speed controllers SC1, SC2 therefore control the switching speed of action for the orifice valve 25.

A sucking-back speed unit 41 is coupled between the EXH of the solenoid valve 27 and the sucking-back valve 26 at a third I/O end 40. The sucking-back speed unit 41 includes two speed controllers SC5, SC6.

Moreover, the solenoid valve 27 also control the pump 23 to start pumping the liquid photoresist 20 to the orifice valve 25 through the one-way valve 24. A speed controller SC3 is coupled between the AIR of the solenoid valve 27 and the pump 23 at a first air control end 36 and a speed controller SC4 is coupled between the EXH of the solenoid valve 27 and the pump 23 at a second air control end 39. The combined result of the first air control end 36 and the second air control end 39 controls the pump 23 for whether pumping the liquid photoresist 20 or not.

In the above coupling manner, the solenoid valve 27 can switch, or control, the pump 23, the orifice valve 25 and the sucking-back valve 26 for photoresist dispensing. Ideally, when the dispensing system is operated at the stopping mode, the orifice valve 25 and the pump 23 are switched off so that the liquid photoresist 20 is not dispensed. Then, the sucking-back valve 26 produces a sucking force on the liquid photoresist 20 so that the liquid photoresist 20 at a duct end 42 is sucked back a little as shown in a magnified drawing. The end surface 43 of the liquid photoresist 20 is concave. The liquid photoresist 20 is avoided to drop a little onto the wafer 20, resulting in a deterioration of the quality of a formed photoresist layer (not shown). Practically, it is difficult for the conventional coupling manner to achieve the ideal operation result.

Similarly, when the dispensing system is switched to the starting mode, the sucking-back valve 26 should ideally release its sucking force before the pump 23 and the orifice valve 25 start operation. Otherwise undesired drops of the liquid photoresist 20 may drop onto the wafer 22 before photoresist coating operation starts. This also deteriorates the quality of the photoresist layer, which is to be formed. Practically, it is difficult for the conventional coupling manner to achieve the ideal operation result.

In summaries, the conventional photoresist dispensing system used to coat a photoresist layer on a wafer has a problem to properly control the action time order of the pump 23, the orifice valve 25 and the sucking-back valve 26. This may cause a few undesired drops of the liquid photoresist 20 to drop onto the wafer 34 and to deteriorate the quality of a photoresist layer to be formed.

SUMMARY OF THE INVENTION

It is therefore an objective of the present invention to provide a photoresist dispensing system, which can prevent undesired liquid photoresist from dropping onto a wafer so that the quality of the formed photoresist layer is maintained.

In accordance with the foregoing and other objectives of the present invention, an improved photoresist dispensing system is provided. The improved photoresist dispensing system includes a pump, a switch valve, a sucking-back valve, a solenoid valve, a first speed controller, a second speed controller, and a sucking-back speed controller. The photoresist dispensing system is divided into two part. One is the transportation part of the liquid photoresist. The other part is a control part driven by air-flow. The pump is used to transport a liquid photoresist. The switch valve including a first air I/O end and a second air I/O end is used to control the transportation of the liquid photoresist to a wafer. The sucking-back valve receives the liquid photoresist from the switch valve and allows the liquid photoresist to be transport to a wafer for forming a photoresist layer. The sucking-back valve also includes a third air I/O end used to produce or release a sucking force to the liquid photoresist from an open end of a transportation duct of the liquid photoresist.

The sucking-back speed controller is coupled between the third air I/O end of the sucking-back valve and the second air I/O end for a purpose to control a delay of switching speed of sucking force on the sucking-back valve. The solenoid valve serving as a switching source controls the action time order of the pump, the switch valve, and the sucking-back valve. The first speed controller is coupled between the first air I/O end and an air-in end of the solenoid valve for a purpose to control the switch speed of the switch valve. The second speed controller is coupled between the second air I/O end and an air-out end of the solenoid valve for a purpose to control the switch speed of the switch valve. Air is injected from the air-in and is exhausted from the air-out so that an air flow is created to control the pump, the switch valve, and the sucking-back valve.

The dispensing system further includes a third speed controller and a fourth speed controller. The third speed controller is coupled between the pump at a first control end and the solenoid valve at the air-in end and The fourth speed controller is coupled between the pump at a second control end and the solenoid valve at the air-out end.

When the solenoid valve triggers a switch of a system operation mode, the pump and the switch valve always act before the sucking-back valve acts to produce or release a sucking force to the liquid photoresist from an open end of a transportation duct of the liquid photoresist

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

The invention basically modifies the conventional couplings architecture between each control units so that a control function is created to prevent undesired liquid photoresist from deteriorating the quality of a photoresist layer.

Figure 1:
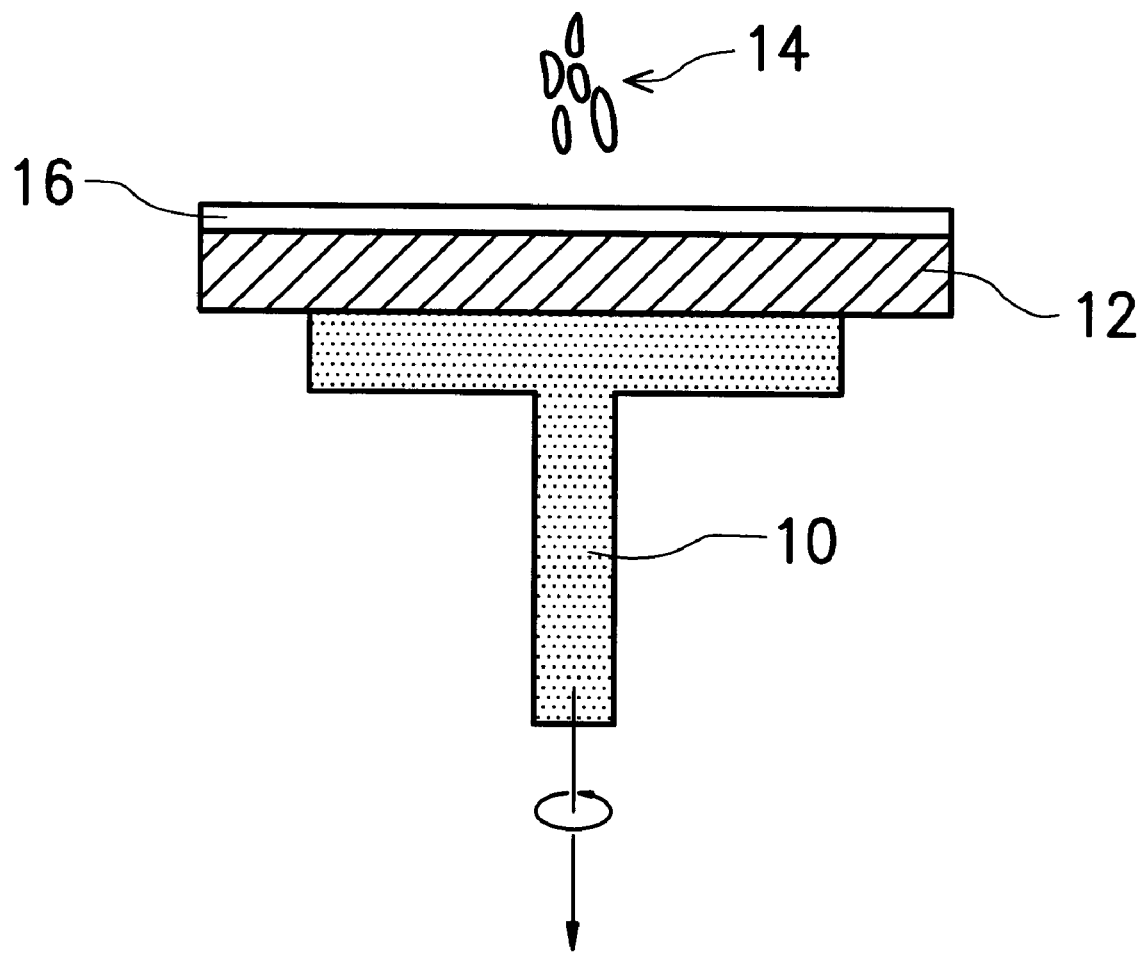
FIG. 1 is a side view of a conventional spinner used for spin coating.
Figure 2:
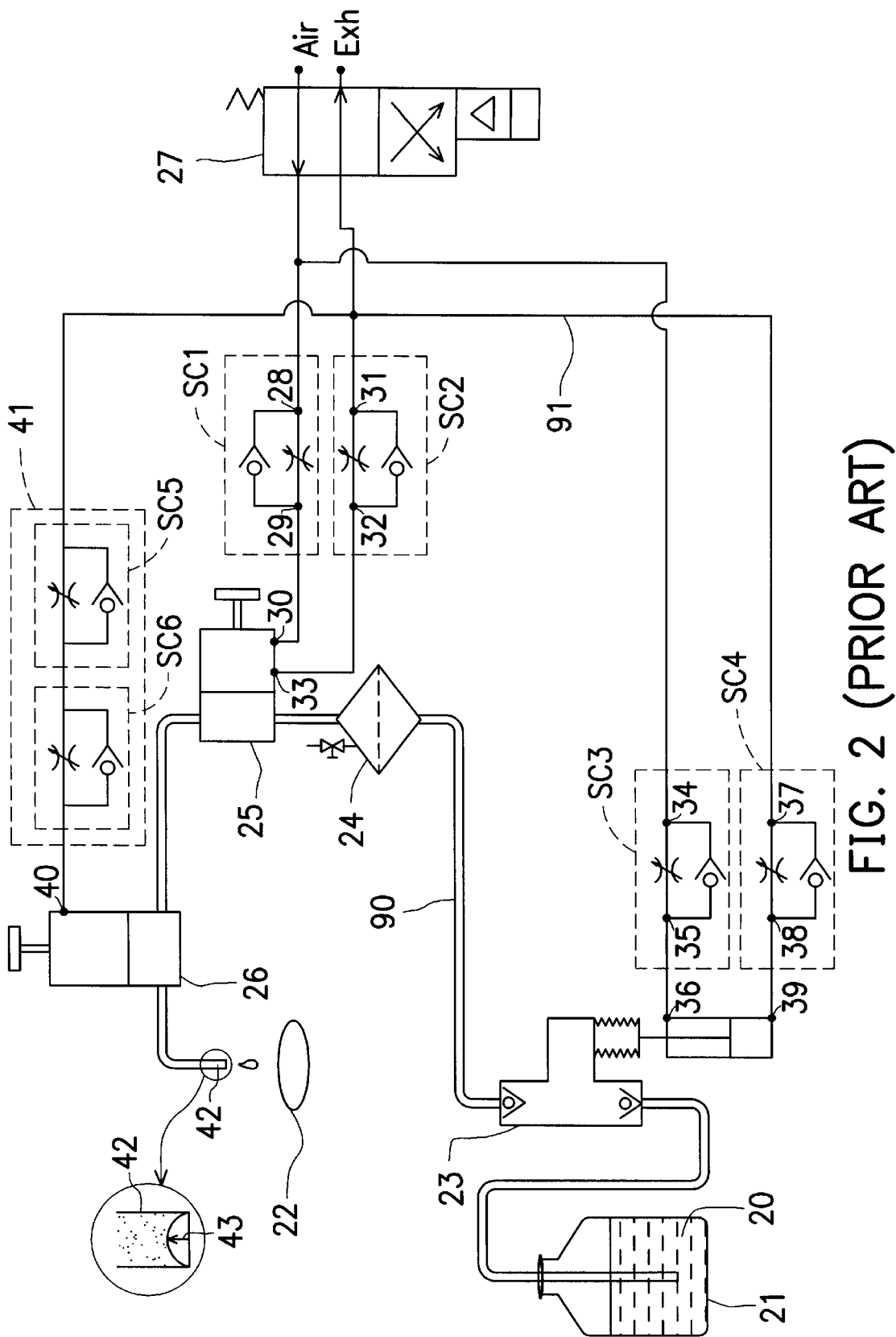
FIG. 2 is a schematic drawing of a conventional photoresist dispensing system included in a photoresist coating machine.
Figure 3:
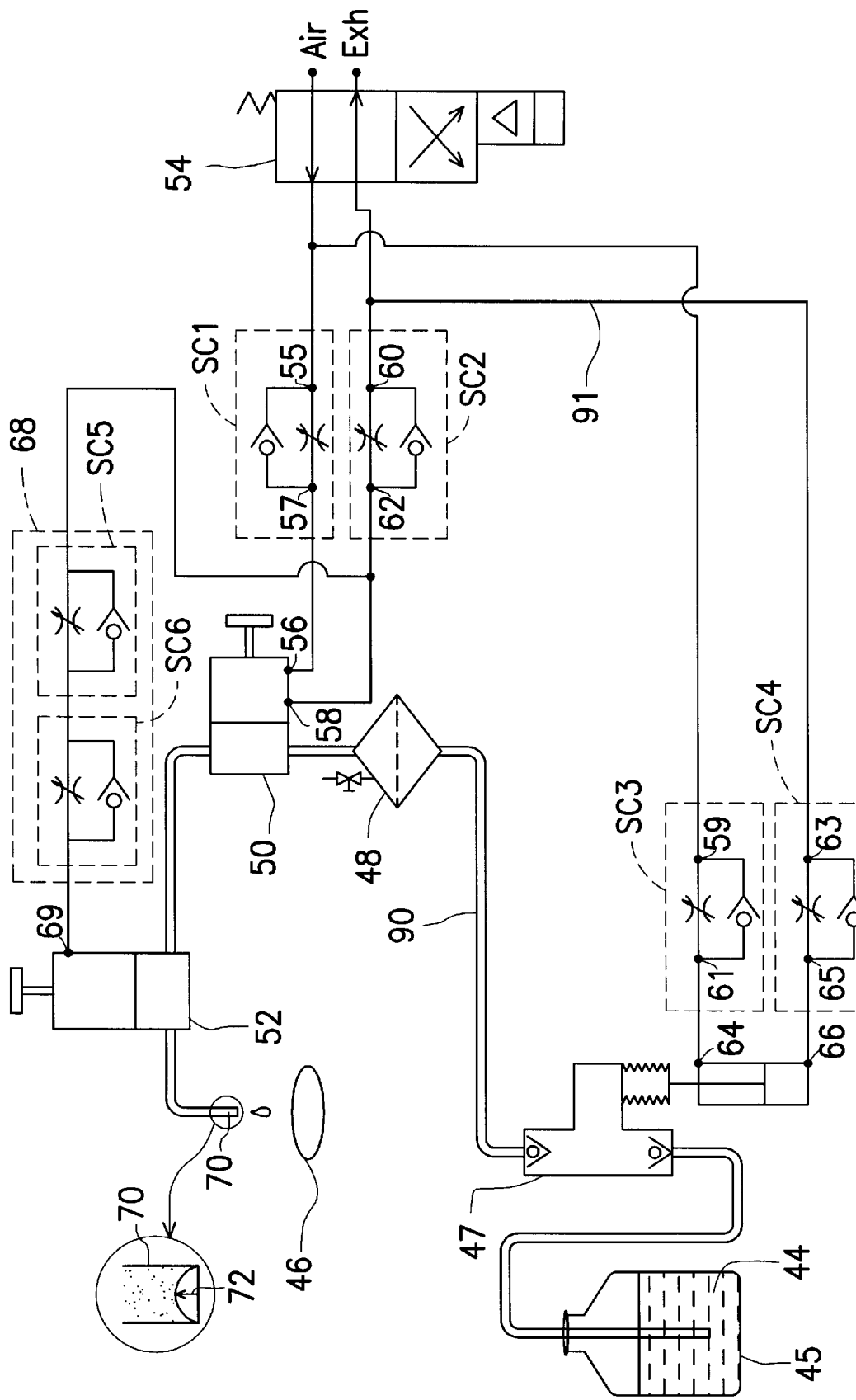
FIG. 3 is a schematic drawing of an improved photoresist dispensing system included in a photoresist coating machine, according to a preferred embodiment of the invention.

FIG. 3 is a schematic drawing of an improved photoresist dispensing system included in a photoresist coating machine, according to a preferred embodiment of the invention. In FIG. 3, the photoresist coating machine is, for example, a D-SPIN type. An improved photoresist dispensing system includes a transporting part and a control part. The transporting part includes a container 45 that contains a liquid photoresist 44. The liquid photoresist 44 is, for example, a kind of chemical solution, which includes, for example, photo-sensitive material. A pump 47 is used to pump the liquid photoresist 44 from the container 45 through a transporting duct 90. The pump 47 transports the liquid photoresist 44 to a filter 48 and then to a switch valve 48, such as an orifice valve, which determines whether the liquid photoresist 44 is to be sent to a wafer 46 or not. If the liquid photoresist 44 is to be transported to the wafer 46, the liquid photoresist 44 passes a sucking-back valve 52 and is transported along the duct 90. The sucking-back valve 52 also can be controlled to produce a sufficient sucking force to hold the liquid photoresist 44 without dropping from the transporting duct 90, and to release the sucking force. This capability is described in the control part in detail.

The control part includes a solenoid valve 54 to control the actions of the switch valve 50 and the sucking-back valve 52 by switching between two operation modes. One is a starting mode that the dispensing system is switched from a resting status to a working status. The other one is a stopping mode that the dispensing system is switched from a working status to a resting status. The control part uses air-flow to achieve its purpose of control. The air flows along a route 91. The solenoid valve 54 includes an air-in end AIR and an air-out end EXH. Air can be injected from the air-in end AIR and exhausted from the air-out end EXH. The solenoid valve 54 uses the EXH and the AIR to produce an air-flow so as to switch system between the starting mode and the stopping mode. The sucking-back valve 52 is controlled by the solenoid valve 54 through air-flow to produce or release a sucking force, which can suck back the liquid photoresist 44 with a little sufficient force to prevent the liquid photoresist 44 from dropping. The switch valve 50 is controlled by the solenoid valve 54 through air-flow to determine whether the liquid photoresist 44 is transported to the wafer 46 or not.

Between the solenoid valve 54 and the switch valve 50, there are two speed controllers SC1, SC2. The speed controller SC1 is coupled between the AIR of the solenoid valve 54 and the switch valve 50 at a first input/output (I/O) end 56. The speed controller SC2 is coupled between the EXH of the solenoid valve 54 and the switch valve 50 at a second I/O end 58. All speed controller used in the photoresist dispensing system are preferably identical with the same purpose to control a switching speed of action. The speed controllers SC1, SC2 therefore control the switching speed of action for the switch valve 50.

The solenoid valve 54 also control the pump 47 to start pumping the liquid photoresist 44 to the switch valve 50 through the one-way valve 48. A speed controller SC3 is coupled between the AIR of the solenoid valve 54 and the pump 47 at a first air control end 64 and a speed controller SC4 is coupled between the EXH of the solenoid valve 54 and the pump 47 at a second air control end 66. The combined result of the first air control end 64 and the second air control end 66 controls the pump 47 for whether pumping the liquid photoresist 44 or not.

A sucking-back speed unit 68 is coupled between a route, which is between the second I/O end 58 of the switch valve 50 and an output end 62 of the second speed controller SC2, and the sucking-back valve 52 at a third I/O end 69. The sucking-back speed unit 68 includes at least on speed controller and preferably includes two speed controllers SC5, SC6. In this coupling manner, the route between the sucking-back valve 52 and the solenoid valve 54 includes three speed controllers SC2, SC5, and SC6, and the route between the switch valve 50 and the solenoid valve 54 includes one controller SC2. The action of the sucking-back valve 52 for producing or releasing its sucking force is therefor sufficiently delayed. This is the main characteristic of the invention. Since the sucking-back valve 52 acts with sufficient delay, when the dispensing system is operated in stopping mode, the sucking-back valve 52 can suck the liquid photoresist 44 back a little from a duct end 70 after the dispensing of the liquid photoresist 44 stops. A magnified drawing about the duct end 70 is shown also. The liquid photoresist 44 at the duct end 70 has a concave surface 72 due to the sucking force from the sucking-back valve 52 so that the liquid photoresist 44 is effectively prevented from dropping onto the wafer 46 after the dispensing system stops. When the dispensing system is operated in starting mode, the sucking-back valve 52 release its suck force after the dispensing of the liquid photoresist 44 starts. The liquid photoresist 44 is effectively prevented from dropping onto the wafer 46 before the dispensing system is just starting. Since the sucking force is much smaller than the transportation force induced by the pump 47, the sucking force does not affect the dispensing of the liquid photoresist 44.

In conclusion, the invention modifies the conventional couplings architecture between the solenoid valve 54 and the sucking-back valve 52 to increase a sufficient delay time of switch on/off the sucking-back valve 52 so that the induced sucking force is created in a proper time order to prevent the liquid photoresist 44 from dropping onto the wafer 46 to result in deteriorating the quality of a photoresist layer.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A chemical solution dispensing system used to dispense a chemical solution onto a wafer, the system comprising:
   a switch valve, used to control whether the chemical solution is transported to the wafer or not, wherein the switch valve comprises a first input/output (I/O) end and a second I/O end, which are used to control the switch valve;
   a sucking-back valve, used to receive the chemical solution from the switch valve and transport the chemical solution to the substrate, wherein the sucking-back valve comprises a third I/O end to trigger a sufficient sucking force to just hold the chemical solution;
   a solenoid valve, triggering all switching actions to control the sucking-back valve and the switch valve, wherein the solenoid valve comprises an air-in end and an air-out end;
   a first speed controller, coupled between the air-in end and the first I/O end, and used to control the switching speed of the switch valve;
   a second speed controller, coupled between the air-out end and the second I/O end, and used to control the switching speed of the switch valve, wherein the second speed controller is also used to delay the switching speed of the sucking-back valve for producing or releasing the sucking force; and
   a sucking-back speed controller, coupled between the third I/O end of the sucking-back valve and a place, which is between the second I/O end and the second speed controller, wherein sucking-back speed controller is used together with the second speed controller to delay switching speed of the sucking-back valve,
   wherein while the solenoid valve triggering the switching actions to control the sucking-back valve and the switch valve, the switch valve is switched on/off through the first and the second speed controllers, and the sucking-back valve is activated with a delay time resulting from the additional sucking-back speed controller.

2. The system of claim 1, wherein the chemical solution comprises liquid photoresist.

3. The system of claim 1, wherein the system is used in a photoresist coating machine.

4. The system of claim 1, wherein the sucking-back speed controller comprises two speed controllers coupled together in series coupling.

5. The system of claim 1, wherein the solenoid valve using air flow to produce the switching actions.

6. The system of claim 1, wherein the switching action comprises a starting action from a resting status to a working status of dispensing the chemical solution, and a stopping action from a working status to a resting status.

7. The system of claim 6, wherein in the stopping action, when the switch valve is switched off to stop transportation of the chemical solution, then the sucking force of the sucking-back valve is produced so that the chemical solution is prevented from dropping on the wafer before the dispensing actually starts.

8. The system of claim 6, wherein in the starting action, the switch valve is switched on to transport the chemical solution before the sucking force of the sucking-back valve is released so that the chemical solution is prevented from dropping on the wafer before the dispensing actually starts.

9. A chemical solution dispensing system used to dispense a chemical solution onto a wafer, the system comprising:
   a pump, used to pump and transport the chemical solution, wherein the pump comprises a first control end and a second control end, which allow a control on the pump for operation;
   a switch valve, used to control whether the chemical solution is transported to the wafer or not, wherein the switch valve comprises a first input/output (I/O) end and a second I/O end, which are used to control the switch valve;
   a one-way filter, which is coupled between the pump and the switch valve and is used to filter the chemical solution;
   a sucking-back valve, used to receive the chemical solution from the switch valve and transport the chemical solution to the substrate, wherein the sucking-back valve comprises a third I/O end to trigger a sufficient sucking force to just hold the chemical solution;

a solenoid valve, triggering all switching actions to control the sucking-back valve and the switch valve, wherein the solenoid valve comprises an air-in end and an air-out end;

a first speed controller, coupled between the air-in end and the first I/O end, and used to control the switching speed of the switch valve;

a second speed controller, coupled between the air-out end and the second I/O end, and used to control the switching speed of the switch valve, wherein the second speed controller is also used to delay the switching speed of the sucking-back valve for producing or releasing the sucking force;

a third speed controller, coupled between the air-in end of the solenoid valve and the first control end of the pump, and used to control the switching speed of the pump;

a fourth speed controller, coupled between the air-out end of the solenoid valve and the second control end of the pump, and used to control the switching speed of the pump; and a sucking-back speed controller, coupled between the third I/O end of the sucking-back valve and a place, which is between the second I/O end and the second speed controller, wherein sucking-back speed controller is used together with the second speed controller to delay switching speed of the sucking-back valve, wherein while the solenoid valve triggering the switching actions to control the sucking-back valve and the switch valve, the switch valve is switched on/off through the first and the second speed controllers, and the sucking-back valve is activated with a delay time resulting from the additional sucking-back speed controller.

10. The system of claim 9, wherein the chemical solution comprises liquid photoresist.

11. The system of claim 9, wherein the system is used in a photoresist coating machine.

12. The system of claim 9, wherein the sucking-back speed controller comprises two speed controllers coupled together in series coupling.

13. The system of claim 9, wherein the solenoid valve using air flow to produce the switching actions.

14. The system of claim 9, wherein the switching action comprises a starting action from a resting status to a working status of dispensing the chemical solution, and a stopping action from a working status to a resting status.

15. The system of claim 14, wherein in the stopping action, when the switch valve is switched off to stop transportation of the chemical solution, then the sucking force of the sucking-back valve is produced so that the chemical solution is prevented from dropping on the wafer before the dispensing actually starts.

16. The system of claim 14, wherein in the starting action, the switch valve is switched on to transport the chemical solution before the sucking force of the sucking-back valve is released so that the chemical solution is prevented from dropping on the wafer before the dispensing actually starts.

* * * * *